(12) United States Patent
Huang et al.

(10) Patent No.: US 12,336,227 B2
(45) Date of Patent: Jun. 17, 2025

(54) THIN FILM TRANSISTOR, SEMICONDUCTOR SUBSTRATE AND X-RAY FLAT PANEL DETECTOR

(71) Applicant: BOE Technology Group Co., Ltd., Beijing (CN)

(72) Inventors: Jie Huang, Beijing (CN); Zhengliang Li, Beijing (CN); Ce Ning, Beijing (CN); Hehe Hu, Beijing (CN); Nianqi Yao, Beijing (CN); Kun Zhao, Beijing (CN); Fengjuan Liu, Beijing (CN); Tianmin Zhou, Beijing (CN); Liping Lei, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 385 days.

(21) Appl. No.: 17/763,297

(22) PCT Filed: Apr. 30, 2021

(86) PCT No.: PCT/CN2021/091596
§ 371 (c)(1),
(2) Date: Mar. 24, 2022

(87) PCT Pub. No.: WO2021/258858
PCT Pub. Date: Dec. 30, 2021

(65) Prior Publication Data
US 2022/0344517 A1    Oct. 27, 2022

(30) Foreign Application Priority Data

Jun. 24, 2020 (CN) .......................... 202010591840.5

(51) Int. Cl.
*H10D 30/67* (2025.01)
*H10D 86/01* (2025.01)
(Continued)

(52) U.S. Cl.
CPC ..... *H10D 30/6757* (2025.01); *H10D 30/6713* (2025.01); *H10D 30/6755* (2025.01);
(Continued)

(58) Field of Classification Search
CPC ........... H01L 29/78696; H01L 27/1225; H01L 27/127; H01L 29/66969; H01L 29/78618;
(Continued)

(56) References Cited

U.S. PATENT DOCUMENTS 5,962,896 A    10/1999  Yabuta et al.
7,981,720 B2    7/2011  Kim et al.
(Continued)

FOREIGN PATENT DOCUMENTS

CN    101626036 A     1/2010
CN    101908489 A    12/2010
(Continued)

OTHER PUBLICATIONS

Jul. 14, 2023—(EP) Extended European Search Report Appn 21830070.5.
(Continued)

*Primary Examiner* — Bitew A Dinke
(74) *Attorney, Agent, or Firm* — Banner & Witcoff, Ltd.

(57) ABSTRACT

A thin film transistor includes a gate electrode, an active layer, a gate insulating layer located between the gate electrode and the active layer, and a source electrode and a drain electrode electrically connected to the active layer. The active layer includes a channel layer and at least one channel protection layer; a material of each of the channel layer and the at least one channel protection layer is a metal oxide semiconductor material. The at least one channel protection layer is a crystallizing layer, and metal elements of the at least one channel protection layer include non-rare earth metal elements including In, Ga, Zn and Sn.

17 Claims, 4 Drawing Sheets

(51) Int. Cl.
*H10D 86/40* (2025.01)
*H10D 86/60* (2025.01)
*H10D 99/00* (2025.01)

(52) U.S. Cl.
CPC ....... *H10D 86/0221* (2025.01); *H10D 86/423* (2025.01); *H10D 86/60* (2025.01); *H10D 99/00* (2025.01)

(58) Field of Classification Search
CPC ............. H01L 29/7869; H01L 27/1285; H01L 29/1054; H10D 30/6757; H10D 30/6713; H10D 30/6755; H10D 86/0221; H10D 86/423; H10D 86/60; H10D 99/00; H10D 30/751; H10D 86/0229
See application file for complete search history.

(56) References Cited

U.S. PATENT DOCUMENTS

| | | | |
|---|---|---|---|
| 8,193,535 B2 | 6/2012 | Ha et al. | |
| 8,530,285 B2 | 9/2013 | Yamazaki et al. | |
| 9,337,344 B2 | 5/2016 | Hanaoka | |
| 9,362,313 B2* | 6/2016 | Morita | H01L 29/78606 |
| 9,773,917 B2 | 9/2017 | Chen et al. | |
| 10,811,444 B2 | 10/2020 | Jiang | |
| 11,588,058 B2* | 2/2023 | Yamazaki | H10D 30/6756 |
| 12,132,121 B2* | 10/2024 | Yamazaki | H10D 30/6755 |
| 2005/0250270 A1 | 11/2005 | Wu et al. | |
| 2006/0134437 A1 | 6/2006 | Lee et al. | |
| 2008/0038882 A1* | 2/2008 | Takechi | H01L 29/4908 257/E29.151 |
| 2011/0140096 A1* | 6/2011 | Kim | H01L 29/7869 257/E29.095 |
| 2011/0156026 A1 | 6/2011 | Yamazaki et al. | |
| 2011/0315980 A1* | 12/2011 | Kim | H01L 29/7869 257/E29.296 |
| 2012/0097965 A1 | 4/2012 | Shin et al. | |
| 2013/0280859 A1* | 10/2013 | Kim | H01L 29/78696 438/104 |
| 2014/0034945 A1* | 2/2014 | Tokunaga | H01L 29/78693 257/43 |
| 2014/0151685 A1* | 6/2014 | Tokunaga | H10D 30/6757 257/43 |
| 2014/0306221 A1* | 10/2014 | Yamazaki | H10D 86/423 257/43 |
| 2015/0060846 A1* | 3/2015 | Yamamoto | H10D 64/691 257/43 |
| 2015/0115264 A1 | 4/2015 | Kato | |
| 2015/0123127 A1* | 5/2015 | Yamazaki | H01L 29/66742 257/43 |
| 2015/0155362 A1* | 6/2015 | Nakazawa | H01L 29/78648 257/43 |
| 2015/0179442 A1* | 6/2015 | Lee | H01L 29/66742 438/104 |
| 2015/0179446 A1 | 6/2015 | Lee et al. | |
| 2015/0243738 A1* | 8/2015 | Shimomura | H10D 62/405 252/519.1 |
| 2018/0033858 A1* | 2/2018 | Moon | H01L 29/78696 |
| 2018/0254352 A1* | 9/2018 | Koezuka | H01L 21/02554 |
| 2018/0277574 A1* | 9/2018 | Ochi | H01L 27/127 |
| 2019/0051758 A1 | 2/2019 | Ochi et al. | |
| 2019/0097059 A1* | 3/2019 | Kikuchi | H01L 29/7869 |
| 2019/0280126 A1* | 9/2019 | Kikuchi | H01L 29/78696 |
| 2019/0326443 A1* | 10/2019 | Suzuki | C23C 14/08 |
| 2020/0027993 A1* | 1/2020 | Xu | H01L 21/02554 |
| 2020/0287054 A1* | 9/2020 | Suzuki | H01L 29/42384 |
| 2021/0083126 A1 | 3/2021 | Xu et al. | |
| 2023/0006070 A1* | 1/2023 | Huang | H01L 29/78696 |
| 2023/0015871 A1* | 1/2023 | Huang | H01L 29/78696 |

FOREIGN PATENT DOCUMENTS

| | | |
|---|---|---|
| CN | 103996717 A | 8/2014 |
| CN | 104733512 A | 6/2015 |
| CN | 105190902 A | 12/2015 |
| CN | 105633170 A | 6/2016 |
| CN | 107146816 A | 9/2017 |
| CN | 107749422 A | 3/2018 |
| CN | 107978607 A | 5/2018 |
| CN | 108780817 A | 11/2018 |
| CN | 110718468 A | 1/2020 |
| KR | 10-20190068058 A | 6/2019 |
| WO | 2017153882 A1 | 9/2017 |

OTHER PUBLICATIONS

Lu, et al., "A Bottom-Gate Indium-Gallium-Zinc Oxide Thin-Film Transistor with an Inherent Etch-Stop and Annealing-Induced Source and Drain Regions", IEEE Transactions on Electron Devices, vol. 62, No. 2, Feb. 2015.
Dec. 30, 2024—(IN) Hearing Notice Application No. IN202317002280.
Feb. 21, 2025—(US) Office Action U.S. Appl. No. 17/782,035.

* cited by examiner

THIN FILM TRANSISTOR, SEMICONDUCTOR SUBSTRATE AND X-RAY FLAT PANEL DETECTOR

The application is a U.S. National Phase Entry of International Application PCT/CN2021/091596 filed on Apr. 30, 2021, designating the United States of America and claiming priority to Chinese Patent Application No. 202010591840.5 filed on Jun. 24, 2020. The present application claims priority to and the benefit of the above-identified applications and the above-identified applications are incorporated by reference herein in their entirety.

TECHNICAL FIELD

Embodiments of the present disclosure relate to a thin film transistor, a semiconductor substrate and an X-ray flat panel detector.

BACKGROUND

Amorphous semiconductor materials are widely used in driving devices of display technology. For example, amorphous silicon thin film transistors are dominant in backplanes of display semiconductor substrates for their characteristics such as simple process, good device uniformity and low temperature manufacture procedure. Metal oxide semiconductor thin film transistors in which amorphous metal oxide semiconductors such as amorphous indium gallium zinc oxide (a-IGZO) and amorphous indium zinc oxide (a-IZO) are used as channels are expected to replace the amorphous silicon thin film transistors to become mainstream display driving devices because of their advantages of high channel mobility and good uniformity for large area.

SUMMARY

At least one embodiment of the present disclosure provides a thin film transistor, including: a gate electrode, an active layer, a gate insulating layer located between the gate electrode and the active layer, and a source electrode and a drain electrode both electrically connected to the active layer; the active layer includes a channel layer and at least one channel protection layer which are overlapped in a stacking direction, and a material of each of the channel layer and the at least one channel protection layer is a metal oxide semiconductor material; the at least one channel protection layer is a crystallizing layer, and metal elements of the at least one channel protection layer include non-rare earth metal elements including In, Ga, Zn and Sn.

In an example, the at least one channel protection layer includes a first channel protection layer located at a side of the channel layer close to the source electrode and the drain electrode; the metal elements of the first channel protection layer further include at least one rare earth metal element.

In an example, the channel layer includes a first channel portion adjacent to the first channel protection layer, the first channel portion at least includes a first surface of the channel layer that is in direct contact with the first channel protection layer, the first channel portion includes at least one rare earth metal element that is as same as the at least one rare earth metal element in the first channel protection layer, and an absolute value of an energy band gap of the first channel portion is smaller than an absolute value of an energy band gap of the first channel protection layer.

In an example, the channel layer further includes a second channel portion located at a side of the first channel portion away from the first channel protection layer in the stacking direction, and an absolute value of an energy band gap of the second channel portion is smaller than the absolute value of the energy band gap of the first channel portion, so that the first channel portion serves as a transition layer between the second channel portion and the first channel protection layer.

In an example, the second channel portion at least includes a second surface of the channel layer away from the first channel protection layer, and the second channel portion does not contain any rare earth metal element that is as same as the at least one rare earth metal element in the first channel protection layer.

In an example, the second channel portion at least includes a second surface of the channel layer away from the first channel protection layer, and the second channel portion includes at least one rare earth metal element that is as same as the at least one rare earth metal element in the first channel protection layer and in the first channel portion; and an atomic percentage of the at least one rare earth metal element in the second channel portion is smaller than an atomic percentage of the at least one rare earth metal element in the first channel portion.

In an example, the at least one channel protection layer is formed by depositing a target material.

In an example, metal elements of the channel layer include In, Ga and Zn.

In an example, the at least one rare earth metal element of the first channel protection layer is selected from the group consisting of Pr, Ir, Tb and Sm.

In an example, the at least one rare earth metal element of the first channel protection layer includes two selected from the group consisting of Pr, Ir, Tb and Sm.

In an example, the at least one rare earth metal element of the first channel protection layer includes Pr and Sm.

In an example, a species number of the at least one rare earth metal element of the first channel protection layer is greater than a species number of at least one rare earth metal element in a surface of the channel layer.

In an example, the at least one rare earth metal element of the first channel protection layer includes a first rare earth metal element and a second rare earth metal element different from each other, and the at least one rare earth metal element in the first channel portion includes the first rare earth metal element but does not include the second rare earth metal element.

In an example, the first rare earth metal element is Pr and the second rare earth metal element is Sm.

In an example, a difference between, the absolute value of any one of the energy band gap of the first channel portion and the energy band gap of the second channel portion, and, the absolute value of the energy band gap of the first channel protective layer, is greater than zero and smaller than or equal to 1.5 eV.

In an example, in the at least one channel protection layer, an atomic percentage of at least one of the non-rare earth metal elements relative to all of the metal elements is greater than or equal to 40 at %.

In an example, in the at least one channel protection layer, an atomic number of one of the non-rare earth metal elements is greater than a sum of atomic numbers of other metal elements.

In an example, in the at least one channel protection layer, the one of the non-rare earth metal elements is Zn or Sn.

In an example, in the at least one channel protection layer, a ratio of a sum of atomic number of the at least one rare earth metal element to a sum of atomic numbers of the non-rare earth metal elements is in a range of 0.1% to 5%.

In an example, the channel layer is a crystallizing layer or an amorphous layer.

In an example, in the metal oxide semiconductor material of the at least one channel protection layer, a species number of the non-rare earth metal elements is N, and a ratio of an atomic number of any one of the non-rare earth metal elements to a sum of atomic numbers of other non-rare earth metal elements is greater than or equal to 1/N.

In an example, the at least one channel protection layer further includes a second channel protection layer located at a side of the channel layer away from the source electrode and the drain electrode.

In an example, in the stacking direction, a thickness of the at least one channel protection layer is greater than or equal to a thickness of the channel layer.

In an example, in the stacking direction, a thickness of the channel layer is in a range of 1 nm to 50 nm.

In an example, in the stacking direction, the thickness of the channel layer is in a range of 5 nm to 20 nm.

In an example, in the stacking direction, a thickness of the at least one channel protection layer is in a range of 20 nm to 100 nm.

In an example, in the stacking direction, the thickness of the at least one channel protection layer is in a range of 30 nm to 60 nm.

In an example, a carrier concentration of the at least one channel protection layer is smaller than a carrier concentration of the channel layer.

At least another embodiment of the present disclosure provides a thin film transistor, including a gate electrode, a gate insulating layer, an active layer, and a source electrode and a drain electrode both electrically connected to the active layer; the active layer includes a channel layer and at least one channel protection layer which are overlapped in a stacking direction, and a material of each of the channel layer and the at least one channel protection layer is a metal oxide semiconductor material; the at least one channel protection layer is a crystallizing layer, and metal elements of the at least one channel protection layer include non-rare earth metal elements and at least one rare earth metal element; the non-rare earth metal elements include at least two selected from the group consisting of In, Ga, Zn and Sn, and the at least two selected from the group consisting of In, Ga, Zn and Sn include at least one of In and Zn.

At least yet another embodiment of the present disclosure provides a semiconductor substrate, including a base substrate and a thin film transistor located on the base substrate; the thin film transistor is the thin film transistor described in any of the above.

At least further another embodiment of the present disclosure provides an X-ray flat panel detector, including the thin film transistor described in any of the above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
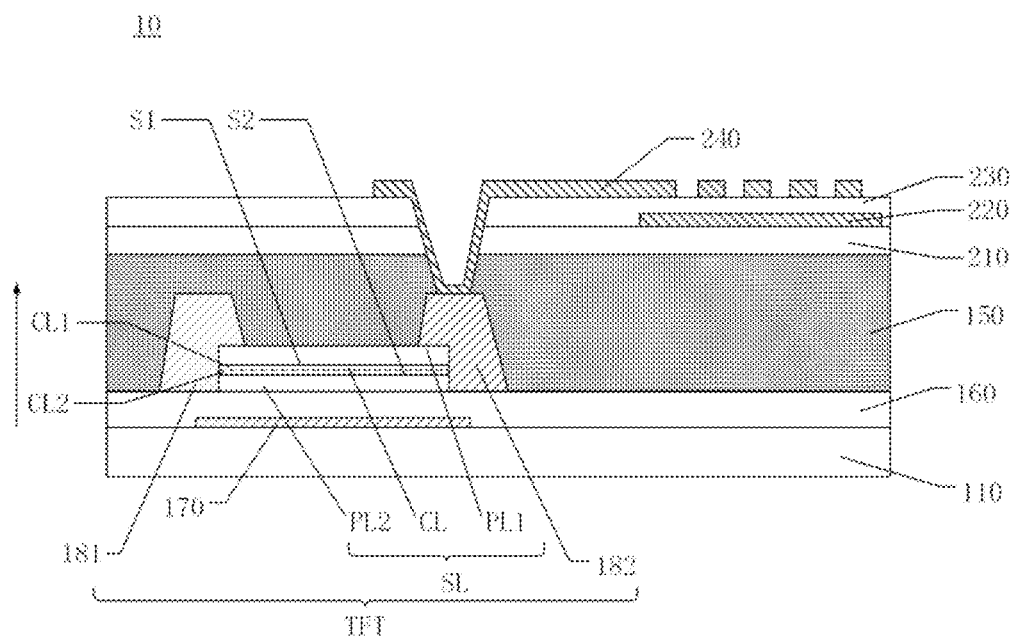
FIG. 1 is a schematic cross-sectional diagram illustrating a structure of a semiconductor substrate according to at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The channel layer of the related back channel etched metal oxide semiconductor thin film transistor is usually a single layer of metal oxide semiconductor with high mobility. In this structure, when source and drain electrodes are etched, the back channel may be eroded by the source-drain etching solution. As the source-drain etching solution causes great damage to the channel layer of metal oxide semiconductor, a large number of defects are formed on the back of the channel, which significantly reduces the mobility of the channel layer and the stability of the thin film transistor, and adversely affects the device characteristics. In addition, there are some interface defects on the interface between the channel layer and each of the gate insulating layer and the passivation layer, which will also reduce the mobility of the channel layer and the stability of the thin film transistor. The channel layer is easily influenced by backlight, light emitted by OLED or ambient light, which leads to a large number of photo-generated carriers inside the channel layer. Under long-term working conditions, it is easy to cause negative bias of the characteristics of thin film transistors (negative bias will cause sandpoint Mura and other problems), which adversely affects the stability of thin film transistors.

At least one embodiment of the present disclosure provides a thin film transistor including a gate electrode, an active layer, a gate insulating layer located between the gate electrode and the active layer, and a source electrode and a drain electrode both electrically connected to the active layer. The active layer includes a channel layer and at least one channel protection layer which are overlapped in a stacking direction, and a material of each of the channel layer and the at least one channel protection layer is a metal oxide semiconductor material. The at least one channel protection layer is a crystallizing layer, and a metal element of the at least one channel protection layer includes non-rare earth metal elements including In, Ga, Zn and Sn.

At least another embodiment of the present disclosure provides a thin film transistor, including a gate electrode, a gate insulating layer, an active layer, and a source electrode and a drain electrode both electrically connected to the active layer. The active layer includes a channel layer and at least one channel protection layer which are overlapped in the stacking direction, and a material of each of the channel layer and the at least one channel protection layer is a metal oxide semiconductor material. The at least one channel protection layer is a crystallizing layer, and a metal element of the at least one channel protection layer includes a non-rare earth metal element and at least one rare earth metal element. The non-rare earth metal element includes at least two selected from the group consisting of In, Ga, Zn and Sn, and the at least two selected from the group consisting of In, Ga, Zn and Sn include at least one of In and Zn.

In this way, the defects of the channel layer can be effectively reduced, thereby effectively improving the overall electrical stability of the thin film transistor (for example, withstand voltage stability and withstand current stability).

FIG. 1 is a schematic cross-sectional diagram illustrating a structure of a semiconductor substrate 10 provided by at least one embodiment of the present disclosure.

At least one embodiment of the present disclosure provides a thin film transistor (TFT). Referring to FIG. 1, a thin film transistor TFT provided by at least one embodiment of the present disclosure is included in a semiconductor substrate 10 provided by at least one embodiment of the present disclosure, for example.

The semiconductor substrate 10 includes, for example, a base substrate 110 and a thin film transistor TFT formed on the base substrate 110.

Referring to FIG. 1, at least one embodiment of the present disclosure provides a thin film transistor TFT, including a gate electrode 170, an active layer SL, a gate insulating layer 160 located between the gate electrode 170 and the active layer SL, and a source electrode 181 and a drain electrode 182 both electrically connected to the active layer SL. The thin film transistor TFT can be a TFT with a top gate structure or a bottom gate structure, for example, a back-channel-etching (BCE) type TFT with a bottom gate structure.

The active layer SL includes a channel layer CL, a first channel protection layer PL1 and a second channel protection layer PL2 which are overlapped in a stacking direction. The first channel protection layer PL1 and the second channel protection layer PL2 are located at opposite sides of the channel layer CL.

Here, the stacking direction may be a direction perpendicular to a main surface of the base substrate 110, as shown by an arrow in FIG. 1.

In the stacking direction, the first channel protection layer PL1 is located at one side of the channel layer CL close to the source electrode 181 and the drain electrode 182, and the second channel protection layer PL2 is located at the other side of the channel layer CL away from the source electrode 181 and the drain electrode 182.

A material of each of the channel layer CL, the first channel protection layer PL1 and the second channel protection layer PL2 is a metal oxide semiconductor material. The first channel protection layer PL1 and the second channel protection layer PL2 each are a crystallizing layer.

Here, the "crystallizing layer" refers to a material layer which is mainly in a crystalline state and may contain tiny amorphous portions. For example, the crystallizing layer may include crystals with a size larger than 10 nm, crystals with a nano-scale size (1 nm to 10 nm), crystals crystallized in various directions, or crystals crystallized in C-axis (CAAC crystals).

The first channel protection layer PL1 that adopts a crystallizing layer is used as, at least, a barrier layer. It is possible to avoid or reduce the back-channel-etching defects caused by etching solution on the side of the channel layer CL close to the source electrode 181 and the drain electrode 182, or to avoid the implantation of atoms such as PVX or metal electrodes, such as O or H, Cu and Al, into the channel layer caused by the annealing process. The first channel protection layer PL1 and the second channel protection layer PL2 of the crystallizing layer can also avoid or reduce interface defects on two opposite surfaces of the channel layer CL. In addition, both the first channel protection layer PL1 and the second channel protection layer PL2 of the crystallizing layer can effectively prevent unwanted impurity elements (such as Cu, Al, H, etc.) from diffusing to the channel layer CL. Therefore, the thin film transistor TFT has improved, overall electrical stability.

If the first channel protection layer PL1 is separately formed on the base substrate and subject to an X-ray diffraction test (for example, the scanning range of diffraction angle is 20° to 70°, and the scanning step-size is 0.02°/s), a raised, crystal diffraction peak can be observed in the denoised XRD pattern. For example, when the material of the first channel protection layer PL1 is an oxide semiconductor containing indium, gallium and zinc, there is a crystal diffraction peak at the diffraction angle of 25°~35° in its XRD diffraction pattern. For the same material with the same thickness, in the XRD pattern obtained by the same XRD test, the higher the intensity of the crystal diffraction peak at the same position is, the smaller the half-width, the larger the ratio of the integral area of the crystal peak to the total integral area and the higher the crystallization degree will be. In addition, it is also possible to judge whether the tested material layer is a crystallizing layer through high-resolution transmission electron microscope photographs and electron diffraction patterns of selected area.

The materials of the first channel protection layer PL1 and the second channel protection layer PL2 may be the same or different. Here, the same material for two or more layers means that, the two or more layers not only contain the same kinds and same numbers of elements, but also have the same proportion for each element in all elements (here, the error of the corresponding proportion within 5% due to process accuracy is allowed). Therefore, different materials for two or more layers mean that, the two or more layers contain different kinds of elements or different numbers of elements or different proportions of each element in all elements.

For example, the metal element of at least one of the first channel protection layer PL1 and the second channel protection layer PL2 includes non-rare earth metal elements including In, Ga, Zn and Sn.

Sn is included in at least one of the first channel protection layer PL1 and the second channel protection layer PL2, which can not only stabilize the whole active layer system of the oxidized object, but also provide certain carriers. On the other hand, the etching of the oxide active layer system can be optimized under certain conditions. For example, the etching rate of the active layer SL containing at least one of the first channel protection layer PL1 and the second channel protection layer PL2 in the etching solution for aluminum is significantly reduced, so that the etching rate of the channel layer CL can be matched by adjusting the content of Sn in the first channel protection layer PL1, thereby alleviating the problems (undercut, tail, etc.) and the risks involved in a laminated etching process.

In another example, the metal element of at least one of the first channel protection layer PL1 and the second channel protection layer PL2 includes non-rare earth metal elements and at least one rare earth metal element; the non-rare earth metal elements include at least two of In, Ga, Zn and Sn, and the at least two of In, Ga, Zn and Sn include at least one of In and Zn.

Here, rare earth metal elements refer to 17 kinds of chemical elements, including scandium series, yttrium series and lanthanide series, in the III subgroup of the periodic table of elements. Non-rare earth metal elements are other metal elements except the rare earth metal elements.

Thus, on one hand, the thin film transistor can have high mobility and good structural stability as a whole; and on the other hand, rare earth metal elements are added into at least one of the first channel protection layer PL1 and the second channel protection layer PL2, so that the at least one of the first channel protection layer PL1 and the second channel protection layer PL2 can absorb part of light and reduce the amount of light incident on the channel layer CL, thereby improving the characteristics of light resistance and water vapor resistance of the thin film transistor devices.

Figure 2A:
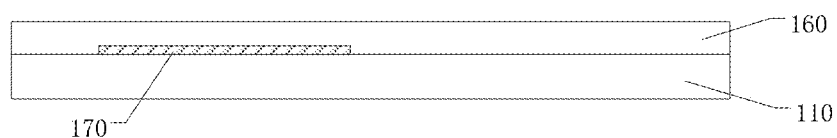
FIGS. 2A to 2G are schematic diagrams illustrating substrate structures corresponding to various steps in a manufacturing method of a semiconductor substrate according to embodiments of the present disclosure.
Figure 2B:
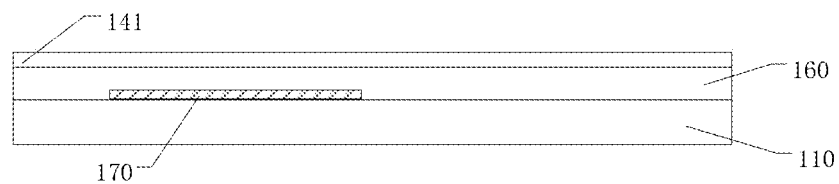
Figure 2C:
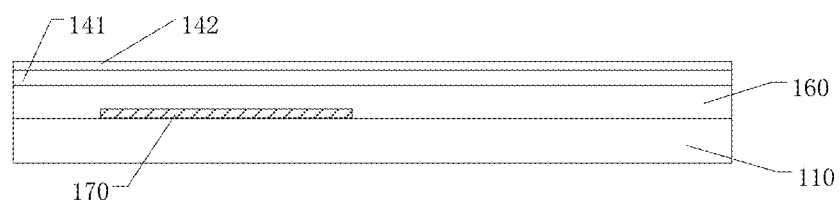
Figure 2D:
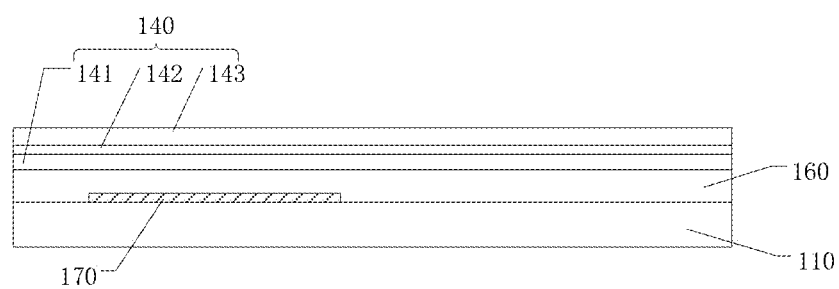

In addition, in one example, a pre-annealing precursor laminated structure 140 of the active layer SL is formed by a sputtering process, as shown in FIGS. 2B to 2D to be described later. In the pre-annealing precursor laminated structure 140, a precursor layer 143 containing rare earth metal elements is used to form the first channel protection layer PL1; a precursor layer 141 containing rare earth metal elements is used to form the second channel protection layer PL2; and a precursor layer 142 not containing rare earth metal element is used to form the channel layer. The rare earth metal element from at least one of the precursor layer 143 and the precursor layer 141 may enter the precursor layer 142 by diffusion during the annealing process, and the precursor layer 142 may be doped therewith, which makes the material of the channel layer CL as formed forms a transition state in the band gap due to the doping of rare earth metal elements, and the transition state becomes a step for the photogenerated carriers to return to the valence band after jumping to the conduction band, so that the photogenerated carriers can be quickly matched, thereby reducing the photogenerated carriers and improving the illumination stability of the channel layer.

For example, the material of at least one of the first channel protection layer PL1 and the second channel protection layer PL2 is different from that of the channel layer CL.

For example, at least one of the first channel protection layer PL1 and the second channel protection layer PL2 is formed by depositing a target material. For example, at least one of the first channel protection layer PL1 and the second channel protection layer PL2 is formed by a physical vapor deposition process using a target including non-rare earth metal elements and at least one rare earth metal element.

For example, in different regions of at least one of the first channel protection layer PL1 and the second channel protection layer PL2 formed by depositing the target material, the same metal element has approximately the same atomic percentage. For example, the same metal element has approximately the same atomic percentage in different regions of the surface of the at least one of the first channel protection layer PL1 and the second channel protection layer PL2 which is formed by depositing the target material. Here, atomic percentage is the proportion of the number of a single type of atom in the total number of atoms.

The physical vapor deposition process is, for example, a sputtering process. The sputtering process is to bombard the surface of solid target by using particles (ions, neutral atoms or molecules) with certain energy, so that atoms or molecules in the surface of the solid target are separated from the target and fall onto, with certain energy, the surface of the base substrate and form a film on the base substrate.

For example, the metal element of at least one of the first channel protection layer PL1 and the second channel protection layer PL2 includes In, Ga, Zn and Sn and at least one rare earth metal element.

For example, the at least one rare earth metal element is selected from the group consisting of praseodymium (Pr), iridium (Ir), terbium (Tb) and samarium (Sm).

For example, the at least one rare earth metal element of at least one of the first channel protection layer PL1 and the second channel protection layer PL2 includes two selected from the group consisting of praseodymium (Pr), Ir, Tb and Sm.

For example, the at least one rare earth metal element of at least one of the first channel protection layer PL1 and the second channel protection layer PL2 includes Pr and Sm.

For example, the metal element of the channel layer CL includes In, Ga and Zn.

Here, the crystalline state of the channel layer CL is not limited. For example, the channel layer CL is a crystallizing layer or an amorphous layer.

The "amorphous layer" refers to a material layer which is mainly in an amorphous state, and may also contain tiny crystallized portions.

For example, the metal elements of the channel layer CL include at least two of In, Ga, Zn and Sn, and the at least two of In, Ga, Zn and Sn include at least one of In and Zn.

In one example, the material of the channel layer CL is indium gallium zinc oxide (IGZO, where I represents indium (In), G represents gallium (Ga), Z represents zinc (Zn) and O represents oxygen). The material of at least one of the first channel protection layer PL1 and the second channel protection layer PL2 is Indium gallium zinc tin rare earth oxide (IGZTMO, where I represents indium (In), G represents gallium (Ga), Z represents zinc (Zn), T represents tin (Sn), M represents rare earth element and O represents oxygen).

It can be understood that although the thin film transistor TFT shown in FIG. 1 includes both the first channel protection layer PL1 and the second channel protection layer PL2, the embodiments of the present disclosure are not limited thereto. In another example, the thin film transistor may include only one of the first channel protection layer PL1 and the second channel protection layer PL2.

In the embodiment shown in FIG. 1, the channel layer CL is in direct contact with each of the first and second channel protection layers PL1 and PL2.

In the stacking direction, the surface of the channel layer CL facing the first channel protection layer PL1 or the surface of the channel layer CL facing the source electrode 181 and the drain electrode 182 is the first surface S1.

In the stacking direction, the surface of the channel layer CL facing the second channel protection layer PL2 or the surface of the channel layer CL facing away from the source electrode 181 and the drain electrode 182 is the second surface S2.

For example, the first channel protection layer PL1 includes at least one rare earth metal element, and the first surface S1 of the channel layer CL includes at least one rare earth metal element. The rare earth metal element in the first surface S1 of the channel layer CL is diffused from the first channel protection layer PL1 into the first surface S1 of the channel layer CL. The second channel protection layer PL2 includes at least one rare earth metal element, and the second surface S2 of the channel layer CL includes at least one rare earth metal element. The rare earth metal element in the second surface S2 of the channel layer CL is diffused from the second channel protection layer PL2 into the second surface S2 of the channel layer CL.

In another example, the first channel protection layer PL1 includes at least one rare earth metal element, and the first surface S1 of the channel layer CL includes at least one rare earth metal element. The rare earth metal element in the first surface S1 of the channel layer CL is diffused from the first channel protection layer PL1 into the first surface S1 of the channel layer CL. For example, the second channel protection layer PL2 does not contain any kind of rare earth metal element, and the second surface S2 of the channel layer CL does not contain any kind of rare earth metal element or rare earth metal element diffused through the first surface S1.

In yet another example, the second channel protection layer PL2 includes at least one rare earth metal element, and the second surface S2 of the channel layer CL includes at least one rare earth metal element. The rare earth metal element in the second surface S2 of the channel layer CL is diffused from the second channel protection layer PL2 into the second surface S2 of the channel layer CL. For example, the first channel protection layer PL1 does not contain any kind of rare earth metal element, and the first surface S1 of the channel layer CL may not contain any kind of rare earth metal element or rare earth metal element diffused through the second surface S2.

Rare earth metal elements enter the channel layer CL by diffusion and the channel layer CL is doped therewith, which makes the channel layer CL form a transition state in the material band gap due to doping treatment, and the transition state becomes a step for the photogenerated carriers to return to the valence band after jumping to the conduction band, so that the photogenerated carriers can be quickly matched, thereby reducing the photogenerated carriers and improving the illumination stability of the channel layer.

For example, the species number of the at least one rare earth metal element in at least one of the first channel protection layer PL1 and the second channel protection layer PL2 is larger than that of the rare earth metal element in the channel layer CL.

For example, the species number of the rare earth metal elements in at least one of the first channel protection layer PL1 and the second channel protection layer PL2 is 2, and the species number of the rare earth metal element in at least one of the first surface S1 and the second surface S2 of the channel layer CL is 1.

For example, at least one rare earth metal element of at least one of the first channel protection layer PL1 and the second channel protection layer PL2 includes a first rare earth metal element and a second rare earth metal element which are different from each other; and the rare earth metal element in at least one of the first surface S1 and the second surface S2 of the channel layer CL includes the first rare earth metal element but does not include the second rare earth metal element.

For example, the first rare earth metal element is Pr, and the second rare earth metal element is Sm.

In one example, the pre-annealing precursor laminated structure 140 of the active layer SL is formed by a sputtering process, as shown in FIGS. 2B to 2D to be described later. In the pre-annealing precursor laminated structure 140, the precursor layer 143 for forming the first channel protection layer PL1 or the precursor layer 141 for forming the second channel protection layer PL2 includes a first sub-layer and a second sub-layer; the first sub-layer is located between the precursor layer 142 and the second sub-layer; and the precursor layer 142 is used for forming the channel layer CL and does not contain any rare earth metal element. The first sub-layer includes, for example, one species of rare earth metal element (e.g., Pr). The second sub-layer includes another one species of rare earth metal element (for example, Sm). After annealing the pre-annealing precursor lamination structure 140, a part of Pr is at least diffused into a corresponding surface of the precursor layer 142, while Sm is not diffused into the corresponding surface of the precursor layer 142. In this way, at least one of the first channel protection layer PL1 and the second channel protection layer PL2 includes two species of rare earth metal elements (for example, Pr and Sm), and only one rare earth metal element (for example, Pr) is included in at least one of the first surface S1 and the second surface S2 of the channel layer CL.

Therefore, it is beneficial to improve at least one of the mobility and the on-state current of the thin film transistor, while improving the illumination stability of the thin film transistor.

For example, the surface of at least one of the first channel protection layer PL1 and the second channel protection layer PL2 facing away from the channel layer CL does not contain any rare earth metal element.

In one example, the pre-annealing precursor laminated structure 140 of the active layer SL is formed by a sputtering process, as shown in FIGS. 2B to 2D to be described later. In the pre-annealing precursor laminated structure 140, the precursor layer 143 for forming the first channel protection layer PL1 or the precursor layer 141 for forming the second channel protection layer PL2 includes a first sub-layer and a second sub-layer; the first sub-layer is located between the precursor layer 142 and the second sub-layer; and the precursor layer 142 is used for forming the channel layer CL and does not contain any rare earth metal element. The first sub-layer includes, for example, only one species of rare earth metal element (for example, Pr). The second sublayer does not contain any rare earth metal element. After annealing the pre-annealing precursor laminated structure 140, a part of Pr is at least diffused into a corresponding surface of the precursor layer 142. In this way, at least one of the first channel protection layer PL1 and the second channel protection layer PL2 includes only one species of rare earth metal element (for example, Pr), and the first surface S1 or the second surface S2 of the channel layer CL also includes only one species of rare earth metal element (for example, Pr). In addition, the rare earth metal element, for example, is not diffused into the surface of the first channel protection layer PL1 or the second channel protection layer PL2 away from the channel layer CL, either.

In the process of forming the source electrode 181 and the drain electrode 182 by wet etching, backside defects may be formed on the side of the first channel protection layer PL1 away from the channel CL; and the side of the second channel protection layer PL2 away from the channel layer CL is in contact with the gate insulating layer, which generates some interface defects. In addition, when the thin film transistor works, due to the band gap difference, the carriers generated by the channel layer CL as a material layer with high carrier concentration have to cross the obstruction of band gap difference of at least one of the first channel protection layer PL1 and the second channel protection layer PL2 before the carriers can be jumped into other film layers. Therefore, most carriers are confined in the channel layer CL. In this way, high-voltage and current resistant stability of the thin film transistor is improved.

In one example, the active layer SL may include only the first channel protection layer PL1 and may not include the second channel protection layer PL2.

In one example, the active layer SL includes a first channel protection layer PL1 and a second channel protection layer PL2; and the metal element of the first channel protection layer PL1 includes at least one rare earth metal element while the second channel protection layer PL2 does not include any rare earth metal element.

For example, the channel layer CL includes a first channel portion CL1 and a second channel portion CL2. In the stacking direction, the first channel portion CL1 is adjacent to the first channel protection layer PL1; the second channel portion CL2 is located at the side of the first channel portion CL1 away from the first channel protection layer PL1. The first channel portion CL1 includes at least the first surface S1 of the channel layer CL that is in direct contact with the first channel protection layer PL1. The second channel portion CL2 includes at least the second surface S2 of the channel layer CL away from the first channel protection layer PL1; here, there may be no obvious interface between the first channel portion CL1 and the second channel portion CL2.

For example, the first channel portion CL1 includes at least one rare earth metal element which is as same as at least one rare earth metal element in the first channel protection layer PL1; the absolute value of the energy band gap of the first channel portion CL1 is smaller than that of the first channel protection layer.

For example, the absolute value of the energy band gap of the second channel portion CL2 is smaller than that of the first channel portion CL1, so that the first channel portion CL1 serves as a transition layer between the second channel portion CL2 and the first channel protection layer PL1.

For example, the second channel portion CL2 does not contain any kind of rare earth metal element that is the same as the at least one rare earth metal element in the first channel protection layer PL1.

For example, the second surface S2 does not contain any kind of rare earth metal element that is the same as the at least one rare earth metal element in the first channel protection layer PL1.

For example, the second channel portion CL2 includes at least one rare earth metal element that is the same as the at least one rare earth metal element in the first channel protection layer PL1 and the first channel portion CL1.

For example, the second surface S2 includes at least one rare earth metal element that is the same as the at least one rare earth metal element in the first channel protection layer PL1 and the first channel portion CL1.

For example, the atomic percentage of the at least one rare earth metal element in the second channel portion CL2 is smaller than the atomic percentage of the at least one rare earth metal element in the first channel portion.

In one example, the pre-annealing precursor laminated structure 140 of the active layer SL is formed by a sputtering process, as shown in FIGS. 2B to 2D to be described later. In the pre-annealing precursor laminated structure 140, the metal elements used for forming the precursor layer 143 of the first channel protection layer PL1 include In, Ga, Zn, Sn and at least one rare earth metal element; the metal elements used for forming the precursor layer 142 of the channel layer CL include In, Ga and Zn; and the precursor layer 141 used for forming the second channel protection layer PL2 does not include any rare earth metal element. After annealing the pre-annealing precursor laminated structure 140, a part of rare earth metal elements in the precursor layer 143 is at least diffused into the corresponding surface of the precursor layer 142. For example, a part of rare earth metal elements in the precursor layer 143 is diffused to a position between two opposite surfaces of the precursor layer 142 in the overlapping direction (for example, the position of the dotted line in FIG. 1). Thus, in the channel layer CL as formed, the first channel portion CL1 includes at least one rare earth metal element diffused from the precursor layer 143, while the second channel portion CL2 does not include any rare earth metal element.

For another example, a part of rare earth metal elements in the precursor layer 143 is diffused to the surface of the precursor layer 142 away from the precursor layer 143 in the overlapping direction. In this way, the channel layer CL as formed includes at least one rare earth metal element diffused from the precursor layer 143 over the entire thickness range in the stacking direction. That is, the first channel portion CL1 includes at least one rare earth metal element diffused from the precursor layer 143, and the second channel portion CL2 also includes at least one rare earth metal element diffused from the precursor layer 143.

For example, the channel layer CL has an energy band gap Eg1, and the first channel protection layer PL1 has an energy band gap Eg2. The absolute value of the energy band gap Eg2 is larger than that of the energy band gap Eg1, and the difference between the absolute value of the energy band gap Eg2 and the absolute value of the energy band gap Eg1 is smaller than or equal to 1.5 eV.

For example, the second channel protection layer PL2 has an energy band gap Eg3. The absolute value of the energy band gap Eg3 is larger than that of the energy band gap Eg1, and the difference between the absolute value of the energy band gap Eg3 and the absolute value of the energy band gap Eg1 is smaller than or equal to 1.5 eV.

For example, the energy band gap Eg2 and the energy band gap Eg3 are each in the range of 3.2 eV to 3.6 eV.

For example, in the case where the channel layer CL includes the first channel portion CL1 and the second channel portion CL2, the difference between, the absolute value of any one of the energy band gap of the first channel portion CL1 and the energy band gap of the second channel portion CL2, and, the absolute value of the energy band gap Eg2 of the first channel protection layer PL1, is greater than zero and smaller than or equal to 1.5 eV.

Increasing the crystallinity (or density) of at least one of the first channel protection layer PL1 and the second channel protection layer PL2 is beneficial to avoid back-channel-etching defects and prevent unwanted impurity elements from diffusing to the channel layer. When at least one of the first channel protection layer PL1 and the second channel protection layer PL2 is formed by depositing a metal oxide semiconductor material through a sputtering process, the temperature of the base substrate, the partial pressure of oxygen in the deposition chamber, the deposition process and other factors can affect the crystallinity of the at least one of the first channel protection layer PL1 and the second channel protection layer PL2. The temperature of the base substrate is one of the main influencing factors. The higher the temperature is, the easier to form the at least one of the first channel protection layer PL1 and the second channel protection layer PL2 with high crystallinity will be. In addition, the crystallinity of a metal oxide semiconductor layer depends on the atomic ratio of a certain metal element, to a certain extent. In order to obtain a metal oxide semiconductor material layer which is easy to be crystallized and has good crystallinity, it is preferable that the atomic percentage of a certain metal element relative to all metal elements is greater than or equal to 40 at %.

For example, in at least one of the first channel protection layer PL1 and the second channel protection layer PL2, the atomic percentage of at least one of the non-rare earth metal elements relative to all the metal elements is greater than or equal to 40 at %.

For example, in at least one of the first channel protection layer PL1 and the second channel protection layer PL2, the atomic number of one of the non-rare earth metal elements is greater than the sum of the atomic numbers of all the other metal elements.

Therefore, it is more advantageous to obtain the at least one of the first channel protection layer PL1 and the second channel protection layer PL2 with good crystallinity.

For example, in at least one of the first channel protection layer PL1 and the second channel protection layer PL2, the atomic number of Zn is greater than the sum of atomic numbers of all other metal elements.

For example, in at least one of the first channel protection layer PL1 and the second channel protection layer PL2, the atomic number of Sn is greater than the sum of atomic numbers of all other metal elements.

In this way, both of good crystallinity and low carrier concentration can be easily achieved in the at least one of the first channel protection layer PL1 and the second channel protection layer PL2.

For example, in at least one of the first channel protection layer PL1 and the second channel protection layer PL2, the ratio of the total atomic number of at least one rare earth metal element to the total atomic number of non-rare earth metal elements is in the range of 0.15% to 40%, preferably in the range of 0.1% to 5%.

For example, the carrier concentration of at least one of the first channel protection layer PL1 and the second channel protection layer PL2 is smaller than that of the channel layer CL.

In this way, when the thin film transistor works, due to the band gap difference, the carrier concentration of at least one of the first channel protection layer PL1 and the second channel protection layer PL2 is low, which reduces the probability that the carriers are captured by the back-channel-etching defects and/or the interface defects, and further improves the electrical performance of the thin film transistor.

For example, the carrier concentration of at least one of the first channel protection layer PL1 and the second channel protection layer PL2 is in the range of $1\times10^{14}$ to $1\times10^{15}$.

For example, the material of at least one of the first channel protection layer PL1 and the second channel protection layer PL2 is IGZMO, and the ratio of atomic number of each metal element is any one of the following: In:Ga:Zn=1:3:6 and Pr/(In+Ga+Zn)=0.1%~2%; In:Ga:Zn=0.5:4:4.5 and Pr/(In+Ga+Zn)=0.1%~2%; In:Ga:Zn=1:3:6 and Sm/(In+Ga+Zn)=0.1%~2%; In:Ga:Zn=1:4:4 and Sm/(In+Ga+Zn)=0.1%~2%; In:Ga:Zn=1:3:6 and (Pr+Sm)/(In+Ga+Zn)=0.1%~2%; In:Ga:Zn=1:4:4 and (Pr+Sm)/(In+Ga+Zn)=0.1%~2%; In:Ga:Zn=1:3:6 and (Pr+Sm)/(In+Ga+Zn)=0.1%~2%; In:Ga:Zn=1:4:4 and (Pr+Sm)/(In+Ga+Zn)=0.1%~2%; In:Ga:Zn=0.5:3:6.5 and (Pr+Sm)/(In+Ga+Zn)=0.1%~2%. Here, In:Ga:Zn represents the ratio of atomic number of In, Ga and Zn in this material. For example, In:Ga:Zn=1:3:6 means that the ratio of atomic number of In, Ga and Zn is 1:3:6. Pr/(In+Ga+Zn) represents the ratio of atomic number of the only one rare earth metal element Pr in this material to the total atomic number of the three non-rare earth metal elements of In, Ga and Zn; Sm/(In+Ga+Zn) represents the ratio of the atomic number of the only one rare earth metal element Sm in this material to the total atomic number of the three non-rare earth metal elements of In, Ga and Zn; Pr+Sm/(In+Ga+Zn) represents the ratio of the sum of the atomic numbers of rare earth metal elements of Pr and Sm to the sum of the atomic numbers of the three non-rare earth metal elements of In, Ga and Zn.

The channel layer CL has a first thickness in the stacking direction, the first channel protection layer has a second thickness in the stacking direction, and the second channel protection layer has a third thickness in the stacking direction, and the ratio of any one of the second thickness and the third thickness to the first thickness is greater than or equal to 1.

For example, in the stacking direction, the thickness of the channel layer is in the range of 1 nm to 50 nm.

For example, in the stacking direction, the thickness of the channel layer is in the range of 5 nm to 20 nm.

For example, in the stacking direction, the thickness of at least one of the first channel protection layer PL1 and the second channel protection layer PL2 is in the range of 20 nm to 100 nm.

For example, in the stacking direction, the thickness of at least one of the first channel protection layer PL1 and the second channel protection layer PL2 is in the range of 30 nm to 60 nm.

In this way, it's more favorable for the at least one of the first channel protection layer PL1 and the second channel protection layer PL2 to avoid back-channel-etching defects and prevent unwanted impurity elements from diffusing to the channel layer CL.

The thin film transistor TFT provided by the embodiment shown in FIG. 1 is a bottom gate type TFT. However, the embodiments of the present disclosure are not limited thereto. In another embodiment, the TFT can be a top gate type TFT.

FIGS. 2A to 2G are schematic diagrams illustrating substrate structures corresponding to various steps in a manufacturing method of a semiconductor substrate 10 according to an embodiment of the present disclosure.

Hereinafter, the manufacturing method of the semiconductor substrate 10 provided by at least one embodiment of the present disclosure will be described with reference to FIGS. 1 to 2G.

Referring to FIG. 2A, a base substrate 110 is provided, and a gate electrode 170 and a gate insulating layer 160 are formed on the base substrate 110. The base substrate 110 may be a rigid substrate or a flexible substrate. For example, the material of the base substrate 110 may be glass, polyimide, polycarbonate, polyethylene, polyacrylate or polyethylene terephthalate, etc. The gate insulating layer 160 may be formed as a single layer of silicon nitride (SiNx) or silicon oxide (SiO$_2$), or a stacked layer of silicon nitride (SiNx) and silicon oxide (SiO$_2$).

Referring to FIGS. 2B to 2D, a metal oxide semiconductor laminated structure 140 is formed on the gate insulating layer 160 by using a physical vapor deposition process, such as a sputtering process. The metal oxide semiconductor laminated structure 140 includes a metal oxide semiconductor layer 141, a metal oxide semiconductor layer 142 and a metal oxide semiconductor layer 143.

Here, the case where the material of the metal oxide semiconductor layer 142 is indium gallium zinc oxide (IGZO), and the material of the metal oxide semiconductor layer 141 and the metal oxide semiconductor layer 143 is indium gallium zinc tin rare earth oxide (IGZMO) is described by way of example. Embodiments of the present disclosure are not limited thereto. In another example, the metal elements of the metal oxide semiconductor layer 141 and the metal oxide semiconductor layer 143 include at least two of In, Ga, Zn and Sn and also include at least one rare earth metal element. The at least two of In, Ga, Zn and Sn include at least one of In and Zn. The material and crystallinity of the metal oxide semiconductor layer 142 are not particularly limited, as long as larger carrier concentration and good mobility are provided.

Here, the case where the metal oxide semiconductor laminated structure 140 is a three-layered structure including a metal oxide semiconductor layer 141, a metal oxide semiconductor layer 142 and a metal oxide semiconductor layer 143 is described by way of example. Embodiments of the present disclosure are not limited thereto. In another embodiment, the metal oxide semiconductor laminated structure 140 may only include the metal oxide semiconductor layer 142 and one of the metal oxide semiconductor layers 141 and 143; that is, the metal oxide semiconductor laminated structure 140 is a two-layered structure. In another embodiment, the metal oxide semiconductor laminated structure 140 may also include other metal oxide semiconductor layer(s), so it can be a structure of 4 or more layers, as long as it includes the metal oxide semiconductor layer 142 and at least one of the metal oxide semiconductor layers 141 and 143.

Referring to FIG. 2B, a metal oxide semiconductor layer 141 is deposited on the gate insulating layer 160 by a physical vapor deposition process (e.g., sputtering process) using a first target. The metal oxide semiconductor layer 141 is a crystallizing layer. The metal oxide semiconductor layer 141 serves as a precursor layer of the second channel protection layer PL2 in the active layer SL to be formed later.

For example, the metal oxide semiconductor layer 141 has a low carrier concentration (for example, the carrier concentration is $1\times10^{14}$-$1\times10^{15}$) and a large band gap (for example, 3.2 eV~3.6 eV). For example, the material of the first target and the metal oxide semiconductor layer 141 is IGZMO, and the ratio of atomic number of each metal element is any one of the following: In:Ga:Zn=1:3:6 and Pr/(In+Ga+Zn)=0.1%~2%; In:Ga:Zn=0.5:4:4.5 and Pr/(In+Ga+Zn)=0.1%~2%; In:Ga:Zn=1:3:6 and Sm/(In+Ga+Zn)=0.1%~2%, In:Ga:Zn=1:4:4 and Sm/(In+Ga+Zn)=0.1%~2%, In:Ga:Zn=1:3:6 and (Pr+Sm)/(In+Ga+Zn)=0.1%~2%; In:Ga:Zn=1:4:4 and (Pr+Sm)/(In+Ga+Zn)=0.1%~2%; In:Ga:Zn=1:3:6 and (Pr+Sm)/(In+Ga+Zn)=0.1%~2%; In:Ga:Zn=1:4:4 and (Pr+Sm)/(In+Ga+Zn)=0.1%~2%; In:Ga:Zn=0.5:3:6.5 and (Pr+Sm)/(In+Ga+Zn)=0.1%~2%. Here, In:Ga:Zn represents the ratio of atomic number of In, Ga and Zn in this material. For example, In:Ga:Zn=1:3:6 means that the ratio of atomic number of In, Ga and Zn is 1:3:6. Pr/(In+Ga+Zn) represents the ratio of atomic number of the only one rare earth metal element Pr in this material to the total atomic numbers of three non-rare earth metal elements of In, Ga and Zn; Sm/(In+Ga+Zn) represents the ratio of atomic number of the only one rare earth metal element Sm in this material to the total atomic numbers of the three non-rare earth metal elements of In, Ga and Zn; (Pr+Sm)/(In+Ga+Zn) represents the ratio of the sum of the atomic numbers of rare earth metal elements of Pr and Sm to the sum of the atomic numbers of the three non-rare earth metal elements of In, Ga and Zn.

Referring to FIG. 2C, a metal oxide semiconductor layer 142 is deposited on the metal oxide semiconductor layer 141 by a physical vapor deposition process (e.g., sputtering process) using a second target. The metal oxide semiconductor layer 142 serves as a precursor layer of the channel layer CL in the active layer SL to be formed later.

For example, the metal element of the metal oxide semiconductor layer 142 includes a material of IGZMO. Here, the crystalline state of the metal oxide semiconductor layer 142 is not limited. For example, the metal oxide semiconductor layer 142 is a crystallizing layer or an amorphous layer.

Referring to FIG. 2D, a metal oxide semiconductor layer 143 is deposited on the metal oxide semiconductor layer 141 by a physical vapor deposition process (e.g., sputtering process) using a third target. The metal oxide semiconductor layer 143 is a crystallizing layer. The metal oxide semiconductor layer 143 serves as a precursor layer of the first channel protection layer PL1 in the active layer SL to be formed later.

For example, the metal oxide semiconductor layer 143 has a low carrier concentration (for example, the carrier concentration is $1\times10^{14}$-$1\times10^{15}$) and a large band gap (for example, 3.2 eV~3.6 eV). For example, the material of the third target and the metal oxide semiconductor layer 141 is IGZMO, and the ratio of atomic number of each metal element is any one of the following: In:Ga:Zn=1:3:6 and Pr/(In+Ga+Zn)=0.1%~2%; In:Ga:Zn=0.5:4:4.5 and Pr/(In+Ga+Zn)=0.1%~2%; In:Ga:Zn=1:3:6 and Sm/(In+Ga+Zn)=0.1%~2%; In:Ga:Zn=1:4:4 and Sm/(In+Ga+Zn)=0.1%~2%; In:Ga:Zn=1:3:6 and (Pr+Sm)/(In+Ga+Zn)=0.1%~2%; In:Ga:Zn=1:4:4 and (Pr+Sm)/(In+Ga+Zn)=0.1%~2%; In:Ga:Zn=1:3:6 and (Pr+Sm)/(In+Ga+Zn)=0.1%~2%; In:Ga:Zn=1:4:4 and (Pr+Sm)/(In+Ga+Zn)=0.1%~2%; In:Ga:Zn=0.5:3:6.5 and (Pr+Sm)/(In+Ga+Zn)=0.1%~2%. Here, In:Ga:Zn represents the ratio of atomic number of In, Ga and Zn in this material. For example, In:Ga:Zn=1:3:6 means that the ratio of atomic number of In, Ga and Zn is 1:3:6. Pr/(In+Ga+Zn) represents the ratio of atomic number of the only one rare earth metal element Pr in this material to the total atomic numbers of three non-rare earth metal elements of In, Ga and Zn; Sm/(In+Ga+Zn) represents the ratio of atomic number of the only one rare earth metal element Sm in this material to the total atomic numbers of the three non-rare earth metal elements of In, Ga and Zn; (Pr+Sm)/(In+Ga+Zn) represents the ratio of the sum of the atomic numbers of rare earth metal elements Pr and Sm to the sum of the atomic numbers of the three non-rare earth metal elements of In, Ga and Zn. The materials of the third target and the first target may be the same or different.

Thus, the pre-annealing precursor laminated structure 140 is formed.

Figure 2E:
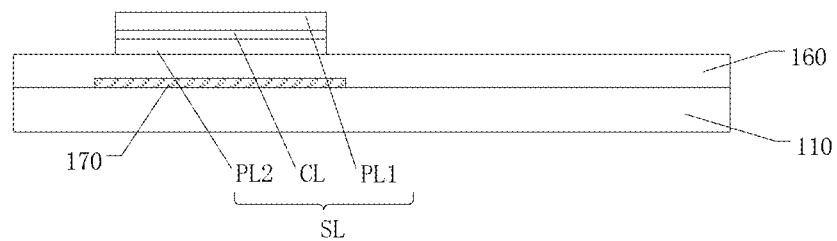

Referring to FIG. 2E, an annealing process and a patterning process are performed on the pre-annealing precursor laminated structure 140 to form an active layer SL.

For example, the annealing process is a heat treatment at a temperature of 300° C. to 380° C. in the atmospheric atmosphere. The time for the heat treatment is, for example, greater than or equal to 30 minutes and smaller than or equal to 2 hours.

For example, the patterning process performed on the laminated structure 140 includes: coating a photoresist layer on the laminated structure 140; exposing and developing the photoresist layer to form a photoresist pattern P; performing a wet etching to the semiconductor laminated structure 140 with the photoresist pattern as a mask to obtain the active layer SL, for example, the wet etching adopts $H_2SO_4$+

HNO₃+H₂O as the etching solution or adopts HNO₃+CH₃COOH+H₃PO4+H₂O as the etching solution; and removing the photoresist pattern.

Figure 2F:
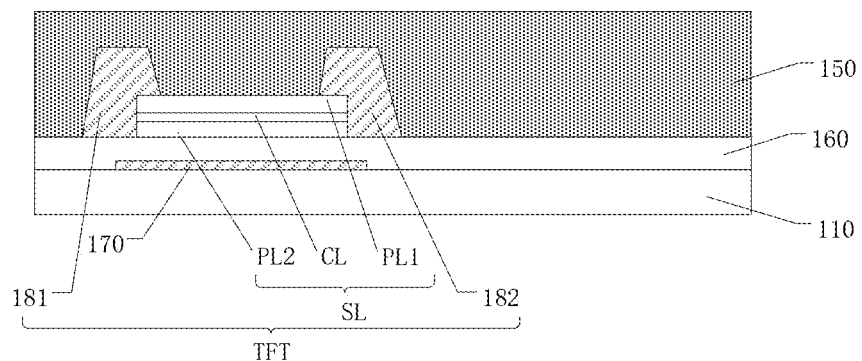

Referring to FIG. 2F, a source electrode 181 and a drain electrode 182 are formed on the base substrate 110, on which the active layer SL has been formed, by a wet etching process; and forming a passivation layer 150 on the base substrate 110 on which the source electrode 181 and the drain electrode 182 have been formed. The source electrode 181 and the drain electrode 182 are directly overlapped with and located above the active layer SL, for example.

The source electrode 181 and the drain electrode 182 may include one or more selected from the group consisting of Au, Ag, Cu, Ni, Pt, Pd, Al, Mo and the like. The source electrode 181 and the drain electrode 182 may be of a single-layered metal or multi-layered metals.

Figure 2G:
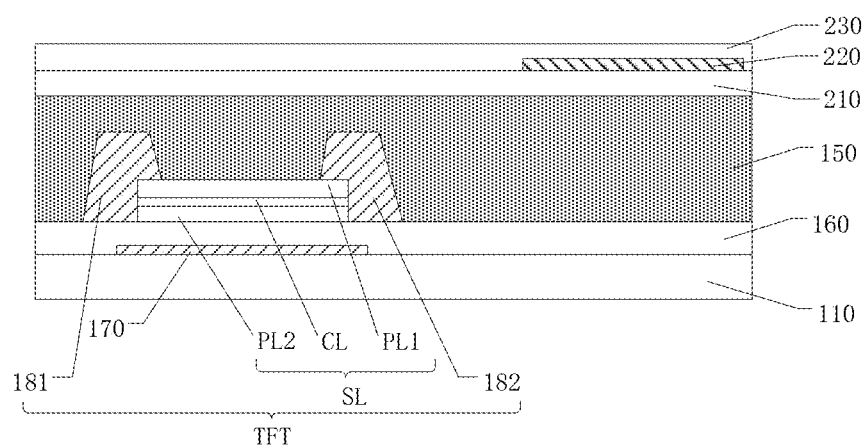

Referring to FIG. 2G, a resin layer 210, a first electrode layer 220 and a passivation layer 230 are sequentially formed on the passivation layer 150.

Referring back to FIG. 1, a through hole exposing the drain electrode 182 is formed in an insulating lamination formed by the passivation layer 150, the resin layer 210 and the passivation layer 230; then a second electrode layer 240 is formed so that a part of the second electrode layer 240 is filled into the through hole and electrically connected with the drain electrode 182, and another part of the second electrode layer 240 overlaps with the first electrode layer 210 in the stacking direction. For example, the first electrode layer 220 serves as a common electrode and the second electrode layer 210 serves as a pixel electrode for controlling the deflection of the liquid crystal material.

It can be understood that in the embodiment shown in FIG. 1, the semiconductor substrate 10 including the metal oxide TFT provided by the embodiments of the present disclosure is an array substrate of a liquid crystal display device. However, the semiconductor substrate provided by the embodiments of the present disclosure is not limited to this. In another embodiment, the semiconductor substrate can be any one selected from the group consisting of an organic light emitting diode (OLED) array substrate, an electronic paper display substrate, a flexible transparent display substrate, a Micro-LED display substrate, a Mini-LED display substrate and a substrate with fingerprint identification function.

At least one embodiment of the present disclosure provides an X-ray flat panel detector including the thin film transistor provided in any of the above embodiments.

In the present disclosure, the following points need to be explained:

(1) The drawings of the embodiments of the present disclosure only refer to the structures related to the disclosed embodiments, and other structures can refer to the general designs.

(2) For clarity, in the drawings used to describe the embodiments of the present disclosure, the thickness of layers or regions is enlarged or reduced, that is, these drawings are not drawn to actual scale.

(3) Without conflict, the embodiments of the present disclosure and the features in the embodiments can be combined with each other to obtain new embodiment(s).

What have been described above are only specific implementations of the present disclosure, and the protection scope of the present disclosure should be determined based on the protection scope of the claims.

What is claimed is:

1. A thin film transistor, comprising: a gate electrode, an active layer, a gate insulating layer located between the gate electrode and the active layer, and a source electrode and a drain electrode both electrically connected to the active layer, wherein,
   the active layer comprises a channel layer and at least one channel protection layer which are overlapped in a stacking direction, and a material of each of the channel layer and the at least one channel protection layer is a metal oxide semiconductor material,
   the at least one channel protection layer is a crystallizing layer, and metal elements of the at least one channel protection layer comprise non-rare earth metal elements including In, Ga, Zn and Sn, wherein
   the at least one channel protection layer comprises a first channel protection layer located at a side of the channel layer close to the source electrode and the drain electrode,
   the channel layer comprises a first channel portion adjacent to the first channel protection layer and a second channel portion located at a side of the first channel portion away from the first channel protection layer in the stacking direction,
   an absolute value of an energy band gap of the first channel portion is smaller than an absolute value of an energy band gap of the first channel protection layer, and an absolute value of an energy band gap of the second channel portion is smaller than the absolute value of the energy band gap of the first channel portion,
   the first channel portion at least comprises a first surface of the channel layer that is in direct contact with the first channel protection layer, the first channel portion comprises at least one rare earth metal element that is as same as the at least one rare earth metal element in the first channel protection layer,
   the second channel portion at least comprises a second surface of the channel layer away from the first channel protection layer, and the second channel portion does not contain any rare earth metal element that is as same as the at least one rare earth metal element in the first channel protection layer, and
   metal elements of the channel layer comprise In, Ga and Zn.

2. The thin film transistor according to claim 1, wherein the metal elements of the first channel protection layer further comprise at least one rare earth metal element.

3. The thin film transistor according to claim 1, wherein the first channel portion serves as a transition layer between the second channel portion and the first channel protection layer.

4. The thin film transistor according to claim 1, wherein the at least one channel protection layer is formed by depositing a target material.

5. The thin film transistor according to claim 2, wherein the at least one rare earth metal element of the first channel protection layer is selected from the group consisting of Pr, Ir, Tb and Sm.

6. The thin film transistor according to claim 5, wherein the at least one rare earth metal element of the first channel protection layer comprises two selected from the group consisting of Pr, Ir, Tb and Sm,
   and/or,
   wherein the at least one rare earth metal element of the first channel protection layer comprises Pr and Sm.

7. The thin film transistor according to claim 1, wherein, the at least one rare earth metal element of the first channel protection layer comprises a first rare earth metal element and a second rare earth metal element different from each other, and the at least one rare earth metal element in the first channel portion comprises the first rare earth metal element but does not comprise the second rare earth metal element.

8. The thin film transistor according to claim 3, wherein a difference between the absolute value of any one of the energy band gap of the first channel portion and the energy band gap of the second channel portion, and the absolute value of the energy band gap of the first channel protective layer, is greater than zero and smaller than or equal to 1.5 eV.

9. The thin film transistor according to claim 1, wherein, in the at least one channel protection layer, an atomic percentage of at least one of the non-rare earth metal elements relative to all of the metal elements is greater than or equal to 40%.

10. The thin film transistor according to claim 1, wherein the channel layer is a crystallizing layer or an amorphous layer.

11. The thin film transistor according to claim 1, wherein, in the metal oxide semiconductor material of the at least one channel protection layer, a species number of the non-rare earth metal elements is N, and a ratio of an atomic number of any one of the non-rare earth metal elements to a sum of atomic numbers of other non-rare earth metal elements is greater than or equal to 1/N.

12. The thin film transistor according to claim 2, wherein the at least one channel protection layer further comprises a second channel protection layer located at a side of the channel layer away from the source electrode and the drain electrode.

13. The thin film transistor according to claim 1, wherein, in the stacking direction, a thickness of the at least one channel protection layer is greater than or equal to a thickness of the channel layer,
and/or,
a carrier concentration of the at least one channel protection layer is smaller than a carrier concentration of the channel layer.

14. The thin film transistor according to claim 1, wherein, in the stacking direction,
a thickness of the channel layer is in a range of 1 nm to 50 nm;
and/or,
a thickness of the at least one channel protection layer is in a range of 20 nm to 100 nm.

15. A semiconductor substrate, comprising a base substrate and a thin film transistor located on the base substrate, wherein the thin film transistor is the thin film transistor according to claim 1.

16. An X-ray flat panel detector, comprising the thin film transistor according to claim 1.

17. A thin film transistor, comprising a gate electrode, a gate insulating layer, an active layer, and a source electrode and a drain electrode both electrically connected to the active layer, wherein,
the active layer comprises a channel layer and at least one channel protection layer which are overlapped in a stacking direction, and a material of each of the channel layer and the at least one channel protection layer is a metal oxide semiconductor material,
the at least one channel protection layer is a crystalizing layer, and metal elements of the at least one channel protection layer comprise non-rare earth metal elements and at least one rare earth metal element, wherein the non-rare earth metal elements comprise at least two selected from the group consisting of In, Ga, Zn and Sn, and the at least two selected from the group consisting of In, Ga, Zn and Sn comprise at least one of In and Zn, wherein
the at least one channel protection layer comprises a first channel protection layer located at a side of the channel layer close to the source electrode and the drain electrode,
the channel layer comprises a first channel portion adjacent to the first channel protection layer and a second channel portion located at a side of the first channel portion away from the first channel protection layer in the stacking direction,
an absolute value of an energy band gap of the first channel portion is smaller than an absolute value of an energy band gap of the first channel protection layer, and an absolute value of an energy band gap of the second channel portion is smaller than the absolute value of the energy band gap of the first channel portion,
the first channel portion at least comprises a first surface of the channel layer that is in direct contact with the first channel protection layer, the first channel portion comprises at least one rare earth metal element that is as same as the at least one rare earth metal element in the first channel protection layer,
the second channel portion at least comprises a second surface of the channel layer away from the first channel protection layer, and the second channel portion does not contain any rare earth metal element that is as same as the at least one rare earth metal element in the first channel protection layer, and
metal elements of the channel layer comprise In, Ga and Zn.

* * * * *